United States Patent [19]
Gaskins et al.

[11] Patent Number: 5,261,068
[45] Date of Patent: Nov. 9, 1993

[54] DUAL PATH MEMORY RETRIEVAL SYSTEM FOR AN INTERLEAVED DYNAMIC RAM MEMORY UNIT

[75] Inventors: Darius D. Gaskins; Thomas H. Holman, Jr.; Michael L. Longwell; Keith D. Matteson, all of Austin; Terry J. Parks, Round Rock, all of Tex.

[73] Assignee: Dell USA L.P., Austin, Tex.

[21] Appl. No.: 530,137

[22] Filed: May 25, 1990

[51] Int. Cl.$^5$ .................. G06F 12/00; G11C 7/00; G11C 8/00

[52] U.S. Cl. .................. 395/425; 364/DIG. 1; 365/230.02; 365/189.05; 365/189.02

[58] Field of Search .................. 395/425; 365/230.02, 365/230.03, 230.04, 189.02, 189.05; 364/DIG. 1

[56] References Cited

U.S. PATENT DOCUMENTS

| | | | |
|---|---|---|---|
| 4,247,920 | 1/1981 | Springer et al. | 365/230.04 |
| 4,685,088 | 8/1987 | Iannucci | 364/200 |
| 4,817,054 | 3/1989 | Banerjee et al. | 365/189.02 |
| 4,888,773 | 12/1989 | Arlington et al. | 364/900 |
| 4,903,197 | 2/1990 | Wallace et al. | 364/200 |
| 4,954,987 | 9/1990 | Auvinen et al. | 365/185.02 |
| 5,016,226 | 5/1991 | Hiwada et al. | 365/230.03 |
| 5,045,714 | 9/1991 | Park et al. | 365/230.02 X |

Primary Examiner—Alyssa H. Bowler
Attorney, Agent, or Firm—Thomas G. Devine; James W. Huffman

[57] ABSTRACT

A digital computer having a dual path memory retrieval system for a dynamic RAM memory unit comprised of any number of interleaved memory banks. The system includes means for asserting and deasserting an access signal to specified locations of the interleaved memory banks, a multiplexer having a pair of input channels for each memory bank and a pair of data paths from the output of each memory bank to the corresponding input channels of the multiplexer. The first data path is a direct path between the memory bank and a first one of the pair of input channels and the second data path is a latched path between the memory bank and a second one of the pair of input channels.

32 Claims, 6 Drawing Sheets

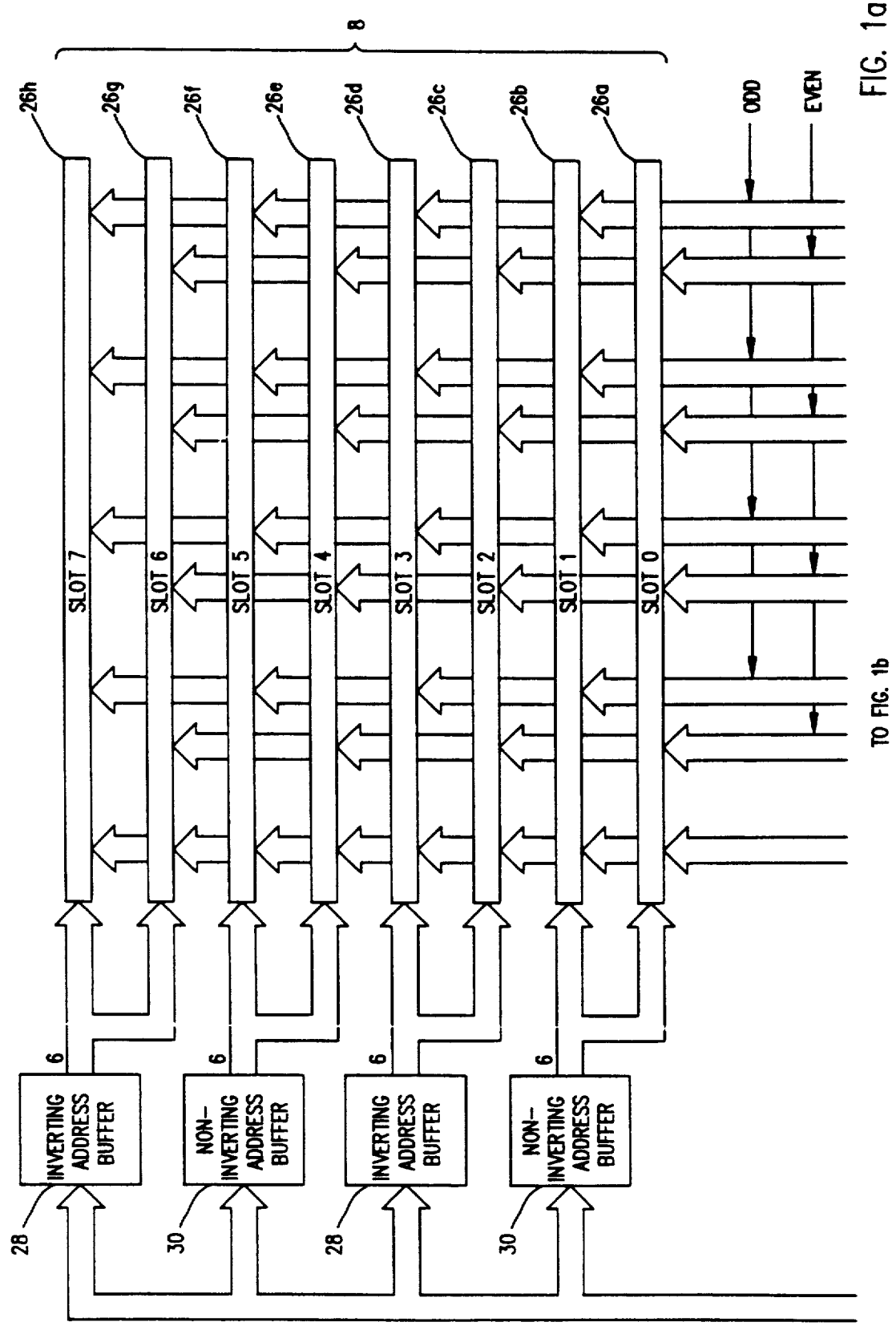

DUAL PATH MEMORY RETRIEVAL SYSTEM FOR AN INTERLEAVED DYNAMIC RAM MEMORY UNIT

CROSS REFERENCE TO RELATED APPLICATIONS

This application is related to the following U.S. Patent Applications:

| Ser. No. | TITLE | INVENTOR | FILING DATE |
| --- | --- | --- | --- |
| 490,003 | Method and Apparatus for Performing Multi-Master Bus Pipelining | Zeller, et al. | 03/07/90 |
| 529,985 | Processor and Cache Controller Interface Lock Jumper | Holman, et al. | 05/25/90 |
| 532,046 | Multiple DRAM Assemblies Using a Single PCB | Holman | 05/25/90 |
| U.S. Pat. No. 5,070,450 | Power-On Coordination System and Method for Multi-Processor | Holman, et al. | |
| 516,628 | Digital Computer Having an Correction Code (ECC) System with Comparator Integrated Into Re-Encoder | Longwell, et al. | 04/30/90 |
| 516,894 | Minimized Error Correction Bad Bit Decoder | Longwell, et al. | 04/30/90 |
| 516,606 | Shared Logic For Error Correction Syndrome Encoding | Longwell, et al. | 04/30/90 |

The above listed applications are all assigned to the assignee of this invention and are herein incorporated by reference.

BACKGROUND OF THE INVENTION

1. Field of the Invention

The invention relates to computer memory systems and, more particularly, to a dual path memory retrieval system for an interleaved dynamic RAM memory unit.

2. Description of Related Art

Data processing systems for computers use memory to store information. More specifically, the data processor of a computer will store individual units of information consisting of a specific number of bits representing binary digits positioned at specific locations within a memory unit. The locations within the memory where data bits are stored, are themselves specified by addresses. Each address consists of a specific number of bits and the total number of bits available for address information defines the total number of memory locations that can be addressed within the computer. The total number of addressable memory locations, in turn, provides a limit to the amount of information that can be stored and accessed by the data processor. This limitation in memory limits the capability of the computer system in performing its data processing functions.

Depending on their access characteristics, computer memory structures may be categorized in either one of two types of memory configurations. One type of memory unit is referred to as the read only memory (or "ROM") type of memory. In general, ROMs are characterized by the permanent storage of memory at selected locations. A random access memory (or "RAM"), on the other hand, is generally characterized by the ability to both write information into and read information out of the memory at any location and in any desired sequence.

A typical RAM consists of a plurality of memory cells, an address decoder, read/write control circuitry and a memory output register. While there are many variations in the structure of and interconnection between the basic elements of RAMs which are utilized to separate different RAM designs into numerous classifications, RAMs may be separated into two distinct types based on the structure of the memory cells used in the memory unit—the "static" RAM (or "SRAM") and the "dynamic" RAM (or "DRAM"). In the SRAM, each memory cell consists of a flip-flop circuit comprised of four or six transistors in which each memory cell has two stable states. As long as power is supplied to the memory cells, the information stored in the cells will be maintained.

In contrast, each memory cell of a DRAM includes a microscopic "storage" capacitor consisting of two conductive layers separated by an insulator. The memory cell of a DRAM stores a single bit of information in the microscopic capacitor as the presence or absence of an electrical charge in that capacitor. A charged capacitor generally represents a "1" and a discharged capacitor generally represents a "0". Usually, a single transistor is used to control the charging of the storage capacitor. Since the electric charge stored in the storage capacitor of a memory cell will gradually leak away, the stored information must be periodically rewritten into the cell before the charge completely leaks out. This periodic rewriting of the information previously stored in the memory cell is called "refreshing" the memory. The frequency at which a memory cell must be refreshed varies depending on the rate of leakage in the control transistor. In a typical DRAM, each memory cell must be refreshed every eight milliseconds or less. Although the refreshing operation requires additional circuitry to coordinate the procedure, the DRAM is often used due to certain advantages over the SRAM. For example, because the DRAM requires only a single control transistor while the SRAM requires a pair of flip-flop transistors, the DRAM occupies a much smaller area on the silicon substrate than the SRAM and is less expensive to manufacture.

In a memory unit which is comprised of DRAMs, both memory access (i.e. writing to or reading from a memory cell) and refresh operations are controlled by a combination of a pair of signals called a row address strobe (or "RAS") signal and a column address strobe (or "CAS") signal, respectively. During a memory access operation, the RAS and CAS signals are used to select the particular memory cell to be accessed. Some DRAMs also require manipulation of both the RAS and CAS signals to perform a refresh cycle. Other DRAMs may be refreshed by activating only the RAS signal. In order to select a desired one of the DRAM storage cells for the reading of data therefrom or the writing of data thereto, a plurality of address inputs are provided to the DRAM. In operation, the high order address bits are first applied to their respective address inputs followed by the assertion of the RAS signal. Assertion of the RAS signal causes the row address of the storage array to be latched within the DRAM. The low order address inputs are next applied, followed by the assertion of the CAS signal to latch the column address of the storage array. The particular combination of the row and column addresses is then decoded by row and column address decoder circuitry to select one of the binary storage cells for reading information therefrom or writing information thereto.

Numerous techniques have been developed to increase the speed at which a computer system operates. In particular, techniques for increasing the speed at which a computer system is capable of writing data to or reading data from its memory unit have been the subject of continuing development. One such technique has been to handle the data to be processed in larger units so that more bits of data are moved through the computer system per unit of time. For example, the 80386 and 80486 microprocessors manufactured by the Intel Corporation of Santa Clara, Calif., utilize 32 bit, double word architectures to handle data faster than the prior art processors which used 16 bit words. Similarly, storing and handling data in system memory in 64 bit units, i.e., four contiguous words of 16 bits each or two contiguous double words of 32 bits each, also enables faster data access. However, because of both connector pin limitations and the fact that current CPUs process data with 32 bit double words, it has been necessary to transmit and handle data in 32 bit units even though 64 bit wide memories can be implemented by interleaving two 32 bit memory banks.

In an interleaved memory system, the data bits which comprise a data block are distributed to specified locations in a series of memory banks for storage. To read the data block, the specified location in each memory bank is accessed and the accessed data bits are multiplexed together to reassemble the data block. Interleaved memory systems are often used to enable the faster handling of data in a computer system. For example, the system of the present invention stores data in 64 bit blocks. However, because the processor and error correction code circuitry of the present system only handles 32 bit double words, interleaving is used to handle the entry and retrieval of each pair of 32 bit double words comprising a 64 bit block (actually each 32 bit data word comprises 39 bits, since with ECC each word also includes 7 syndrome bits, so that a total 78 bit block is formed).

An interleaved memory system distributes the components of a data block among a series of memory banks. To process the data block, therefore, the distributed components of the data block must be reassembled. Thus, while a particular address in a series of memory banks may be simultaneously read by asserting a single CAS signal, if the series of memory banks are interleaved with each other, the outputs of the memory banks must be processed serially, one after the other. As a result, a next address cannot be accessed until the previous read operation is completed and the rate at which data may be retrieved from the memory unit is significantly reduced.

The use of latching techniques can avoid such a result. A latch is a logic device where the output will follow the input upon the receipt of a separate clock pulse. If the output of each memory bank is input into a latch, a next memory access may be commenced while the latches continue to transfer data from the first memory access. However, the use of latching techniques generally introduce additional time delays into a data read, most notably in the time required to read the first data component, because of the time delay inherent in latching the latch output to its input.

SUMMARY OF THE INVENTION

In one aspect, the present invention is of a digital computer which includes a system for reading data from a memory unit having a plurality of locations for storage of information therein. The system comprises means for accessing a memory location to commence a reading of data stored therein, a multiplexer having a first input channel connected along a direct path to the output of the memory unit, a second input channel connected along a latched path to the output of the memory unit and means for controlling the order in which the multiplexer receives from the input channels for multiplexing. In one embodiment, when the memory access means accesses a first location to begin reading the data stored therein, the multiplexer receives data from the accessed location along the direct path until the access of the first memory location is complete. The multiplexer will then switch channels to begin receiving the same data from the same first memory location along the latched path. The accessing means will then access a next location before the multiplexer receives all data from the first memory location.

In another aspect of the invention, the invention is of a digital computer which is provided with a system for reading data from a memory unit having first and second interleaved memory banks. The system comprises means for asserting and deasserting an access signal to specified locations of the first and second memory banks, a multiplexer having first, second and third input channels, and first and second latches. The first input channel is tied directly to the output of the first memory bank. The input of the first latch is also tied to the output of the first memory bank and the output of the first latch is tied to the second input channel. The input of the second latch is tied to the output of the second memory bank and the output of the second latch is tied to the third input channel. Upon asserting the access signal, the first and second memory banks each output data stored at the specified location. In one embodiment, the multiplexer receives data stored at the specified location of the first memory bank from the first input channel until the access signal (CAS) deasserts. The latches close and the multiplexer thereafter receives data from the specified locations of the first and second memory banks from the second and third input channels.

In yet another aspect of the invention, there is provided a digital computer having a system for reading data from a memory unit comprised of a plurality of interleaved memory banks. The system comprises means for simultaneously accessing a memory location in each of the interleaved memory banks to begin reading the data stored at the memory locations and for selectively latching the data, a multiplexer having a pair of input channels for each of the interleaved memory banks and parallel data transfer paths from each of the interleaved memory banks to the multiplexer. Each of the parallel data transfer paths include a direct path from the interleaved memory bank to one of the pair of multiplexer input channels corresponding to that memory bank and a latched path from the interleaved memory bank to the other of the pair of multiplexer input channels corresponding to that bank. In one embodiment, the multiplexer receives data from the accessed memory locations along the direct paths until the access signal is deasserted. The multiplexer then receives data from the accessed memory locations along the latched paths.

In still another aspect of the invention, a digital computer having a system for writing data to and reading data from a memory unit having first and second interleaved memory banks, each having a plurality of memory locations and an input/output data line for writing data to and reading data from the plurality of memory locations, is provided. The system comprises a two-way data bus, means for asserting and deasserting an access signal to specified locations of the first and second memory banks whereby each of the memory banks either output data stored at a first location or input data into the first location in response to a first assertion of the access signal, a multiplexer having first, second, third and fourth input channels, an output channel tied to the two-way data bus, and first, second, third and fourth latches. The first and fourth input channels are tied directly to the output of the first and second memory banks, respectively. The input of the first latch is also tied to the output of the first memory bank and the output of the first latch is tied to the second input channel. The input of the second latch is tied to the output of the second memory bank and the output of the second latch is tied to the third input channel. The input of the third latch is tied to the two-way data bus and the output is tied to the first memory bank input/output bus. Similarly, the input of the fourth latch is tied to the two-way data bus and the output is tied to the second memory bank input/output bus. Upon asserting the access signal, the first and second memory banks each output data stored at the specified location. In one embodiment, the multiplexer receives data stored at the specified location of said first memory bank from the first input channel until the access signal deasserts. The latches close and the multiplexer thereafter receives data from the specified locations of the memory banks from the second and third input channels.

It is an object of this invention to provide a memory retrieval system for reading data from a memory unit comprised of a series of interleaved memory banks.

It is another object of this invention to provide a memory retrieval system for reading data from a series of interleaved memory banks which eliminates time delays resulting from required serial processing of data stored at first locations within the series of memory banks during a first read operation by permitting accesses to a next location within the memory banks to commence a next read operation while the first read operation continues.

It is yet another object of this invention to provide a memory retrieval system for reading data from a series of interleaved memory banks which eliminates time delays resulting from the use of latches during data reads by providing the data output by each memory bank to dual memory paths, one direct and one latched, and multiplexing the two during serial processing of the data read.

BRIEF DESCRIPTION OF THE DRAWINGS

The present invention may be better understood, and its numerous objects, features and advantages will become apparent to those skilled in the art by referencing the accompanying drawings in which:

FIGS. 1(a) and 1(b) are block diagrams of a computer system having a dual path memory retrieval system constructed in accordance with the teachings of the present invention;

DETAILED DESCRIPTION OF THE INVENTION

Figure 1B:
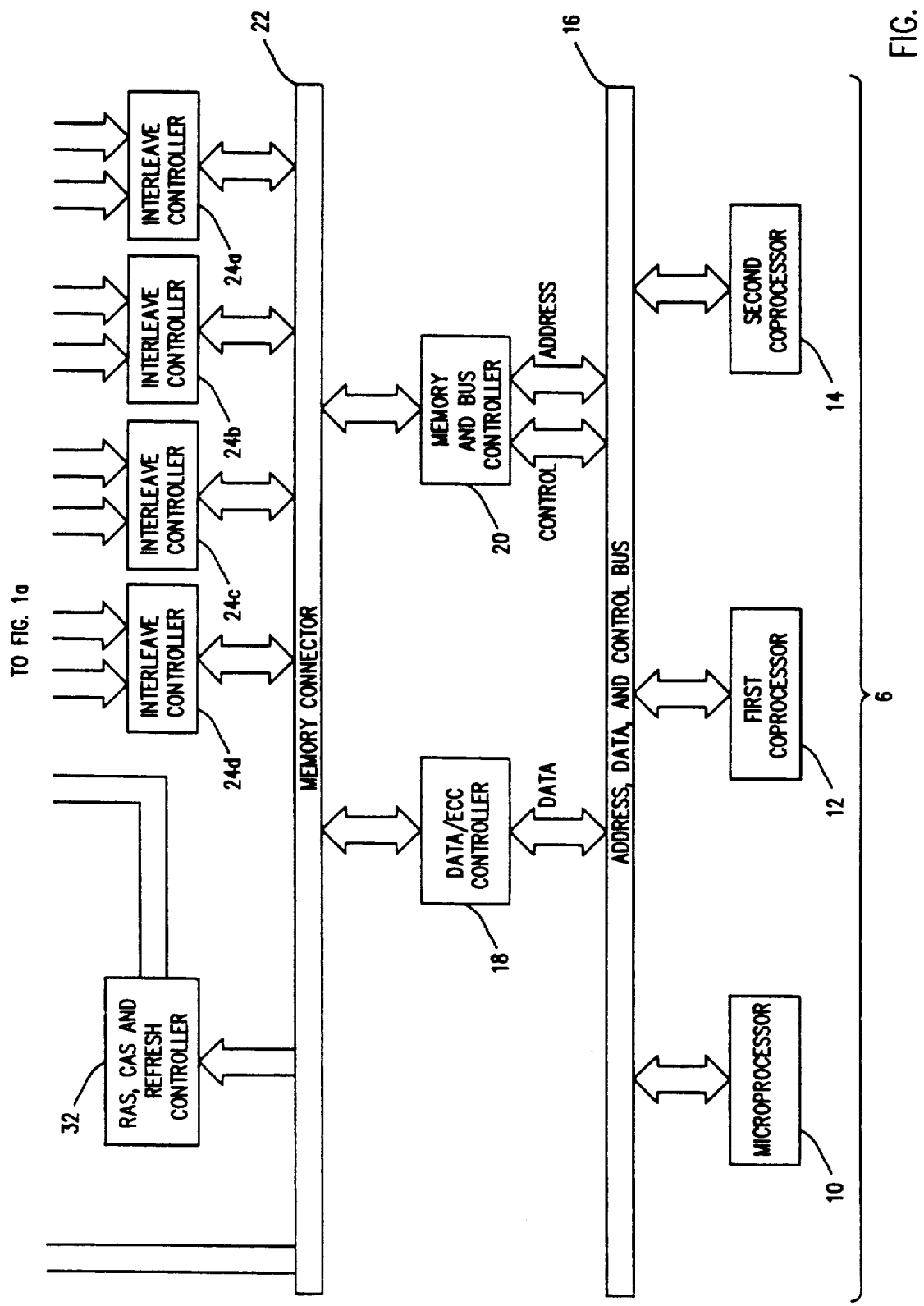

Referring first to FIG. 1, the interconnection between a data processor 6 and a memory unit 8 of a digital computer system will now be described. A data processor for use in a digital computer system may be comprised of any number of interconnected components. For example, it is contemplated that a computer system incorporating the dual path memory retrieval system and interleaved DRAM memory unit which is the subject of the present invention may include a data processor 6 comprised of a microprocessor 10 such as a Model 80386 microprocessor manufactured by the Intel Corporation, a first coprocessor 12 such as a Model 80387 numerical coprocessor, also manufactured by the Intel Corporation and a second coprocessor 14 such as a Model 3167 coprocessor manufactured by the Weitek Company. The microprocessor 10, the first coprocessor 12 and the second coprocessor 14 are interconnected with each other via an address, data and control bus 16 of conventional design.

The flow of data between the data processor 6 and the memory unit 8, which is more fully described below, is controlled by a data flow and error correction code (or "Data/ECC") controller 18. Control and address signals from the data processor 6 to the memory unit 8 are transmitted by a memory and bus (or "memory/bus") controller 20. The data/ECC controller 18 and the memory/bus controller 20 transmit and receive memory data, memory address signals and memory control signals to and from the memory unit 8 via a memory connector 22. Controllers 18 and 20 are described in more detail in the Related Applications set out herein.

From the memory connector 22, data is written to and read from the memory unit 8 via a series of interleave controllers 24a-24d as is more fully discussed below. In one embodiment, the memory unit 8 is comprised of at least one memory card having a series of slots provided thereon for receiving memory banks 26a-26h comprised of DRAM memory components, which in this preferred embodiment, are configured in the form of single in line memory modules (or "SIMMS"). Data is stored in 64 bit blocks, but because the processor and ECC circuitry only handle 32 bit double words, interleaving is used to effect the entry and retrieval of each pair of 32 bit double words. Such words are each stored as a 64 bit block in the form of two interleaved memory banks of 32 bit double words, one odd and one even. Each interleave controller 24a-24d multiplexes eight bits of data between the memory connector 22 and the memory banks 26a-26h. In other words, for a read command, each interleave controller 24a-24d accesses eight even data bits from an even memory bank and eight odd data bits from an odd memory bank.

Also provided between the memory connector 22 and the memory banks 26a-26h are inverting address buffers 28 and non-inverting address buffers 30 for minimizing electrical noise. A RAS, CAS and refresh controller 32 receives encoded control signals from the memory connector 22 and, in turn, transmits decoded control signals, i.e. the previously discussed RAS and CAS signals, to the memory banks 26a-26h as they are needed to access a data location. In addition, the RAS, CAS and refresh controller 32 also generates refresh signals to the memory banks 26a-26h to refresh the DRAM memory components.

Figure 2:
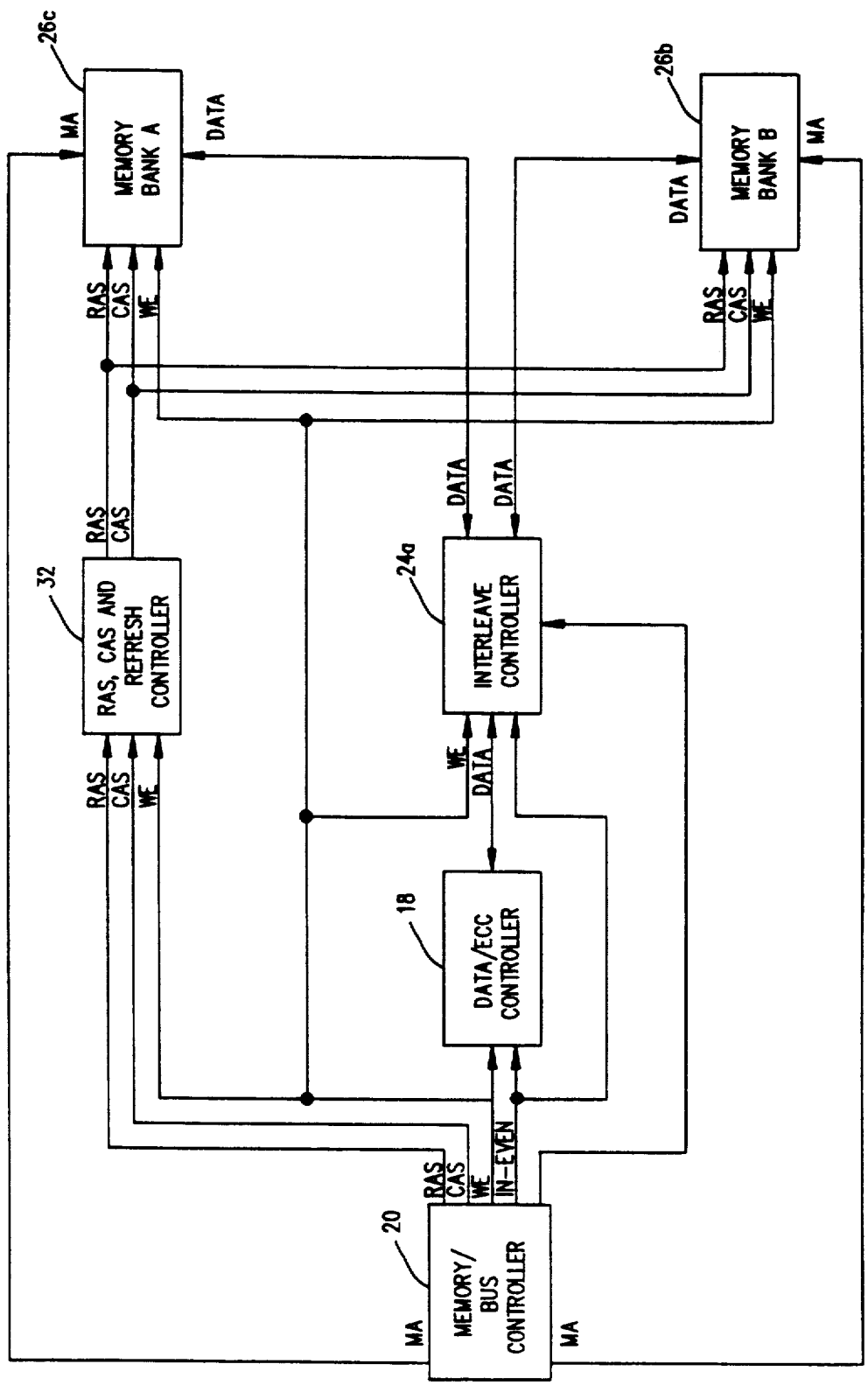
FIG. 2 is a schematic diagram of the data and control signal interconnections between the memory/bus controller, the data/ECC controller and the memory unit illustrated in FIG. 1.

Referring next to FIG. 2, the interconnection between the data/ECC controller 18, the memory/bus controller 20, the interleave controller 24a, the RAS, CAS and refresh controller 32, and the memory banks 26a and 26b will now be described in greater detail. Generally, the memory/bus controller 20 transmits a plurality of control signals to the data/ECC controller 18, the interleave controller 24a, the RAS, CAS and refresh controller 32 and the memory banks 26a, 26b, respectively, which permit the retrieval of information from the memory banks 26a, 26b and the storage of information in the memory banks 26a, 26b.

More specifically, as the address, data and control bus 16 cannot simultaneously service the processor 6 and the memory unit 8, a write enable (or "WE") signal controls whether the address, data and control bus 16 is to service the processor 6 or the memory unit 8. When the address, data and control bus 16 is required to read information from or write information to the memory unit 8, the WE signal is enabled, thereby permitting the transfer of control signals between the memory/bus controller 20 and the memory banks 26a, 26b as well as the transfer of data between the data/ECC controller 18 and the memory banks 26a, 26b. When the WE signal is enabled for a read or write operation, a specified location within the memory banks 26a, 26b to which the data is to be read from or written to must be accessed. To access the specified location, the memory/bus controller 20 transmits a series of address signals. More specifically, a signal is transmitted along a memory address (or "MA") bus by the memory/bus controller 20 to the memory banks 26a, 26b. The MA bus transmits the previously discussed high and low order address bits in appropriate order. The memory/bus controller 20 also transmits encoded RAS and CAS signals to the RAS, CAS and refresh controller 32. The RAS, CAS and refresh controller 32 decodes the encoded signals and transmits decoded RAS and CAS signals to the memory banks 26a, 26b as they are needed to access a data location by latching the specified memory location for which a read or write operation is desired.

Figure 3:
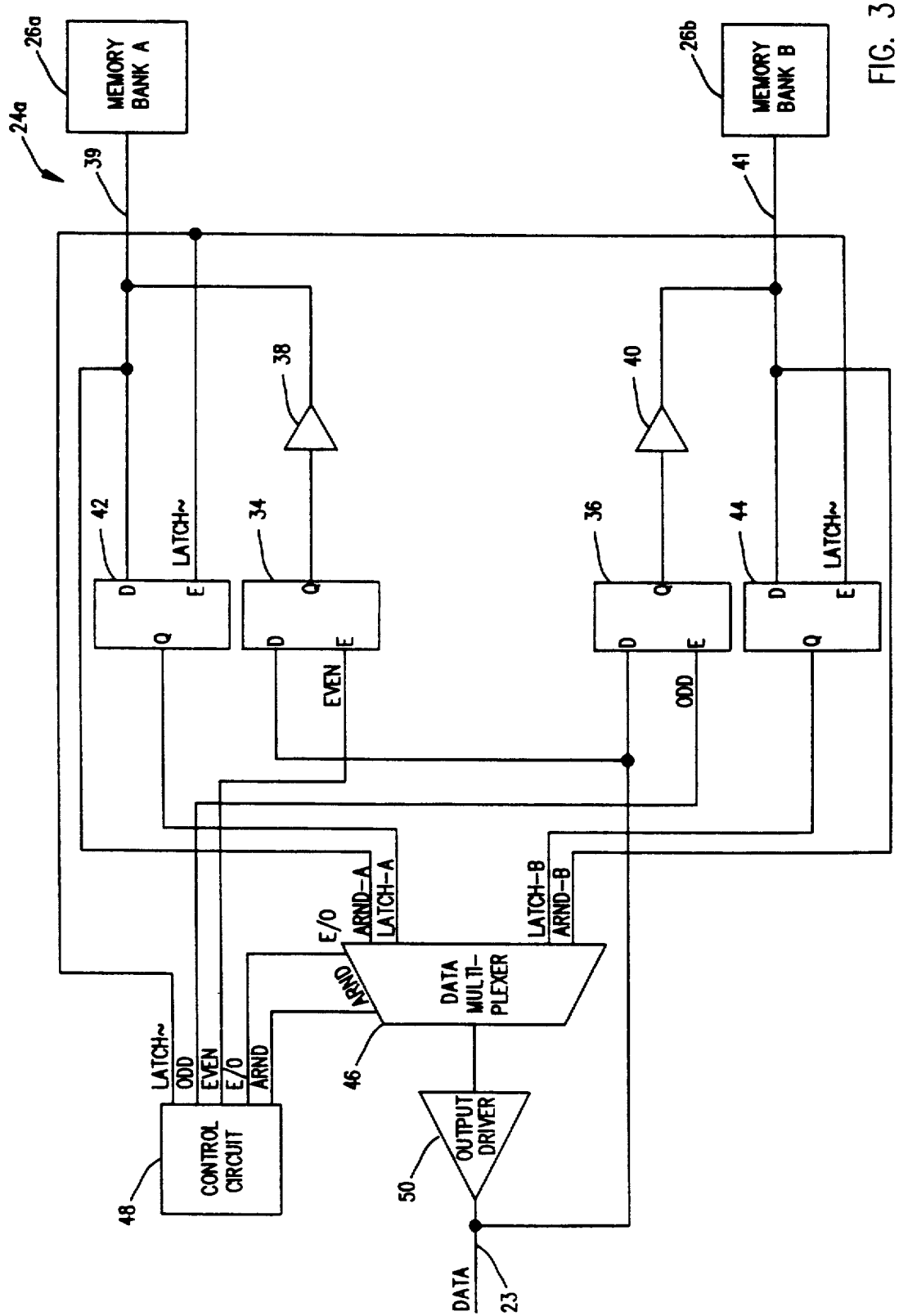
FIG. 3 is a schematic diagram of the interleave controller illustrated in FIGS. 1 and 2.

Referring next to FIG. 3, the interleave controller 24a will now be described in greater detail. Interleave controller 24a includes a first (or "even") write latch 34, a second (or "odd") write latch 36, a first (or "even") read latch 42, and a second (or "odd") read latch 44. Each write latch 34, 36 should preferably be a positive level latch of conventional design and include a data (or "D") input, an enable (or "E") input tied to a control circuit 48 and a Q output tied to the memory banks 26a, 26b, respectively. Each read latch 42, 44 should preferably be a positive enable latch of conventional design and include a D input tied to the memory banks 26a, 26b, respectively, an E input tied to the control circuit 48 and a Q output tied to a data multiplexer 46. Data to be written to the memory banks 26a, 26b are transmitted from the data/ECC controller 18 to the D inputs of the even and odd write latches 34, 36 via a two-way data bus 23. The even write latch 34 will open, thereby transferring the D input to the Q output upon receipt of an enabling signal, i.e. a logical "1", at the E input from an EVEN signal generated by the control circuit 48. By "an EVEN signal", it is herein intended to refer to a periodic signal which alternates between high or logical "1" states and low or logical "0" states. The Q output of even write latch 34 is input to an output driver 38 which, in turn, drives input/output line 39 to the accessed location in the memory bank 26a, thereby writing data designated as "even" to the accessed location in the memory bank 26a.

Similarly, the odd write latch 36 will open, thereby transferring the D input to the Q output upon receipt of an enabling signal, i.e. a logical "1", at the E input from an ODD signal generated by the control circuit 48. By "an ODD signal", it is herein intended to refer to a periodic signal having a frequency and amplitude equal to the frequency and amplitude of the EVEN signal and shifted 180 degrees such that the logical "1" state of the ODD signal is generated when the EVEN signal is a logical "0" and the logical "0" state of the ODD signal is generated when the EVEN signal is a logical "1". The Q output of odd write latch 36 is input to an output driver 40 which, in turn, drives input/output line 41 to the accessed location in the memory bank 26b, thereby writing data designated as "odd" to the accessed location in the memory bank 26b. It is this arbitrary designation of data bits provided to the write latches 34, 36 as even or odd and the transmission of such arbitrarily designated data bits to separate memory banks based solely on their designation, which provides the interleaving of data between the memory banks 26a, 26b.

When the information stored at the specified location in the interleaved memory banks 26a, 26b is to be read, the memory banks 26a, 26b will, upon receiving an accessing signal from the RAS, CAS and refresh controller 32 at the specified location, transmit the contents of the accessed location to a data multiplexer 46. More specifically, each memory bank 26a, 26b simultaneously transmits data along two data paths to the data multiplexer 46. The first data paths are direct paths from the memory banks 26a, 26b, respectively, to the data multiplexer 46 and are hereby designated as the ARND-A and ARND-B paths, respectively. The second data paths are latched paths from the memory banks 26a, 26b, respectively, to the data multiplexer 46 and are hereby designated as the LATCH-A and LATCH-B paths, respectively. Data output by the memory bank 26a to the LATCH-A path is input into the D input of the read latch 42. The read latch 42 will close, thereby latching the Q output from the read latch 42 to the D input of the read latch 42 upon receipt at the E input of the read latch 42 of a logical "0" from a LATCH~ signal output by the control circuit 48. The Q output from the read latch 42 is, in turn, input into the data multiplexer 46. Similarly, data output by the memory bank 26b to the LATCH-B path is input into the D input of the read latch 44. The read latch 44 will close, thereby latching the Q output from the read latch 44 to the D input of the read latch 44 upon receipt at the E input of the read latch 44 of a logical "0" from the LATCH-~ signal output by the control circuit 48. The Q output from the read latch 44 is, in turn, input into the data multiplexer 46 also.

The data multiplexer 46 is of conventional design. The data multiplexer 46 includes four input channels for receiving data from the ARND-A, LATCH-A, ARND-B and LATCH-B paths. The data multiplexer 46 sequentially scans the channels and multiplexes the signals into a single signal of increased bandwidth which is then output via an output channel of the data multiplexer 46 to an output driver 50 which, in turn, drives the multiplexed output to the two-way data bus 23. The scanning sequence is controlled by an ARND signal and a E/O signal output by the control circuit 48.

The data multiplexer 46 further includes sequencing means controlled by the ARND and E/O signals for determining the sequence for which data received at the four input channels from the ARND-A, ARND-B, LATCH-A and LATCH-B paths is multiplexed. The ARND signal selects whether the data multiplexer 46 will multiplex data from the direct paths or from the latched paths. When the ARND signal is high, the data multiplexer 46 multiplexes data from the ARND-A and ARND-B paths only. On the other hand, when the ARND signal goes low, the data multiplexer 46 multiplexes data from the LATCH-A and LATCH-B paths only. For the path type (direct or latched) selected by the ARND signal, the E/O signal controls whether the data to be multiplexed is from the memory bank 26a (even) or the memory bank 26b (odd). More specifically, when the E/O signal goes high, the data multiplexer 46 will either multiplex data from the memory bank 26a supplied to the ARND-A path or data from the memory bank 26a supplied to the LATCH-A path. Similarly, when the E/O signal goes low, the data multiplexer 46 will either multiplex data from the memory bank 26b supplied to the ARND-B path or data from the memory bank 26b supplied to the LATCH-B path.

Figure 4:
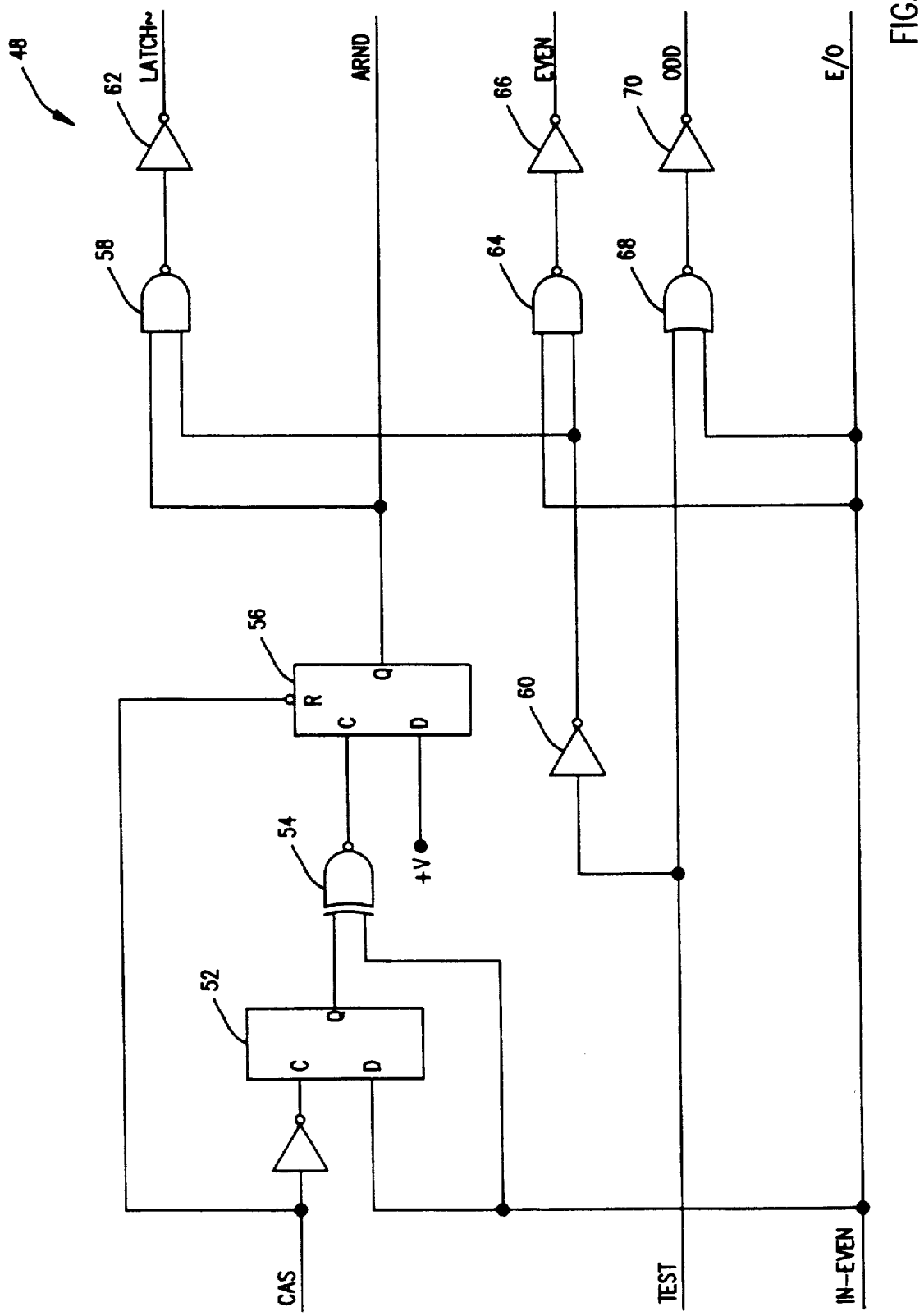
FIG. 4 is a schematic diagram of the control signal circuit illustrated in FIG. 3.

Referring next to FIG. 4, the control circuit 48 will now be described in greater detail. As previously stated, the control circuit 48 generates a series of control signals which control the storage of information to and the retrieval of information from the memory banks 26a, 26b. More specifically, the control circuit 48 supplies the LATCH~ signal to the read latches 42, 44, respectively, to control the transmission of data via data paths LATCH-A and LATCH-B to the data multiplexer 46; the EVEN and ODD signals to the write latches 34, 36, respectively, to control the interleaving and writing of data to the memory banks 26a, 26b; and the ARND and E/O signals to the data multiplexer 46, to control the sequence in which the signals received on the ARND-A, LATCH-A, ARND-B and LATCH-B paths are multiplexed.

The control circuit 48 which generates the aforementioned signals is comprised of a series of logic gates interconnected as herein described. An "IN-EVEN" signal is generated by the memory/bus controller 20 for the control circuit 48. The IN-EVEN signal is tied to the D input of D-type flip-flop 52 and the CAS~ signal from the memory/bus controller 20 is tied to the clock (or "CLK") input of the flip-flop 52. The Q output of the flip-flop 52 is provided as a first input to an XNOR gate 54 and the IN-EVEN signal is provided as a second input to the XNOR gate 54. The output of the XNOR gate 54 is, in turn, tied to the CLK input of a second D-type flip-flop 56. The flip-flop 56 also has a D input tied to +V and a clear input to which the CAS signal is applied. The Q output of the flip-flop 56 is output by the control circuit 48 as the ARND signal. The ARND signal is controlled by the CAS and IN-EVEN signals. When the CAS signal is asserted, for example, when an access of a memory location is commenced, and the IN-EVEN signal returns to the value it had when the previous cycle's CAS had deasserted, the ARND signal will go high. When the CAS signal is deasserted, for example, when the access of the memory location is complete, the ARND signal goes low, regardless of the IN-EVEN signal.

A TEST input to the control circuit 48 is irrelevant to this invention. The TEST input is primarily intended to be utilized to test the control circuit 48 for proper operation. With respect to the generation of control signals, the TEST input may be considered to be a logical "0" input to the control circuit 48. Accordingly, as inverter 60 is tied to the TEST input, the output of inverter 60 will be a logical "1". The output of inverter 60 is provided as a second input to the NAND gate 58 and as a first input to a NAND gate 64. The output of the NAND gate 58 is inverted by an inverter 62 and output from the control circuit 48 as the LATCH~ signal. The LATCH~ signal behaves like the ARND signal when TEST is a logical "0". Returning to NAND gate 64, the logical "1" output by the inverter 60 and the IN-EVEN signal are input thereto. The output of NAND gate 64, which is identical to the inverse of the IN-EVEN signal, is inverted by an inverter 66 and output from the control circuit 48 as the EVEN signal, a signal which is identical to the E/O signal when TEST is a logical "0". Finally, the TEST and IN-EVEN signals are provided as first and second inputs to an OR gate 68. Here, as the TEST signal is a logical "0", the IN-EVEN signal remains unchanged as the output of the OR gate 68. As the output of the OR gate 68 is tied to an inverter 70, the output of the inverter 70, which is output by the control circuit 48 as the ODD signal, is the inverse of the EVEN signal.

Figure 5:
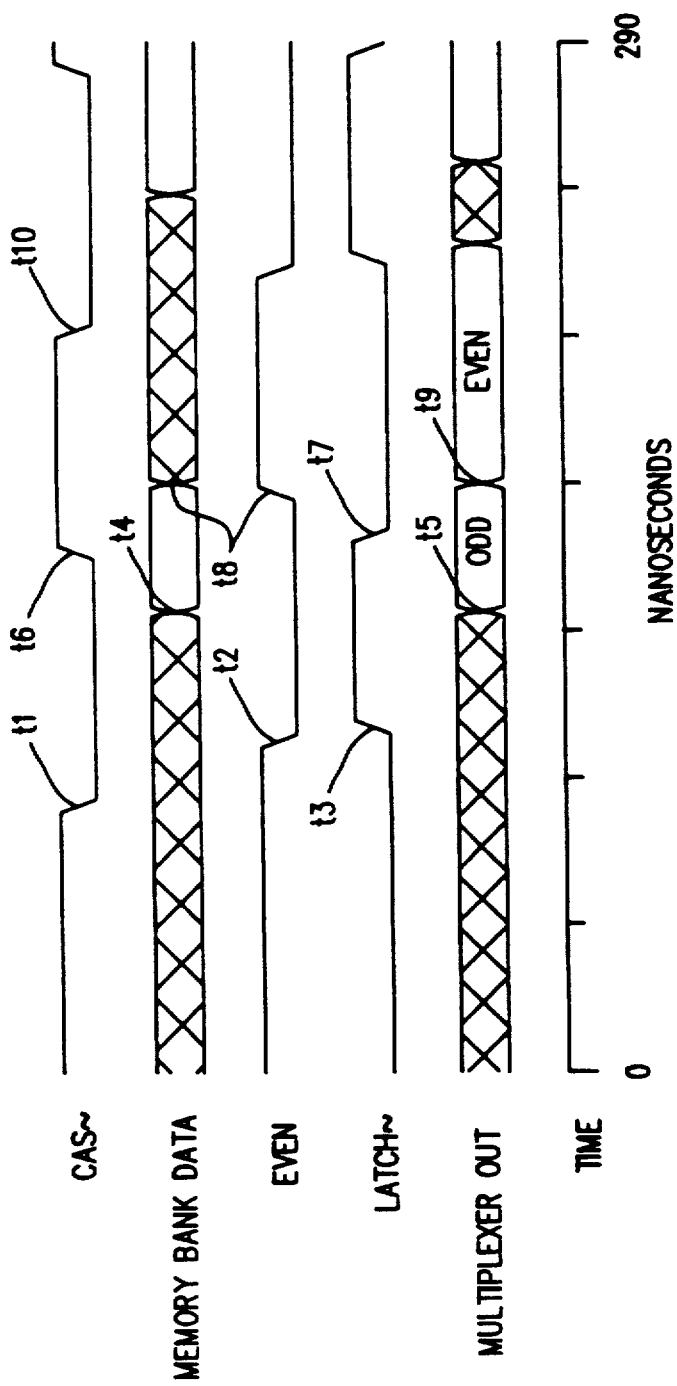
FIG. 5 is a timing diagram illustrating the transfer of data during a memory retrieval sequence.

Referring next to FIG. 5, the operation of the memory retrieval system of the present invention will now be described in detail by reference to the illustrated timing diagram. As previously discussed, the assertion of the CAS signal generated by the RAS, CAS and refresh controller 32 accesses a location specified by the column address in the interleaved memory banks 26a, 26b. As is typical in numerous memory retrieval systems, the assertion of the CAS~ signal, which occurs at time $t_1$ in FIG. 5, validates the data stored at the specified location for transmission. DRAM memory cells generally have, however, a time delay between data validation and data output. Thus, while the data in the specified locations in the memory banks 26a, 26b are accessed at time $t_1$, the data stored at the specified locations are not output until time $t_4$, which is typically 20 nanoseconds after an accessing signal is asserted.

The EVEN signal is appropriately clocked so that the EVEN signal changes from a logical "1" to a logical "0" shortly after the assertion of CAS~. After the CAS~ signal is asserted at time $t_1$, the EVEN signal is deasserted at time $t_2$. As the assertion of the CAS~ signal and the deassertion of the EVEN signal drives the LATCH~ signal high at time $t_3$, the read latches 42 and 44 open. Recalling that the ARND and LATCH~ signals are identical, the ARND signal goes high as well. Accordingly, the data multiplexer 46 is configured after time $t_3$ to receive data from the memory bank 26b along the ARND-B path. At time $t_4$, the time delay between data validated upon the assertion of CAS~ and the output of the validated data ends. Accordingly, at time $t_4$, the data at the specified location of the memory bank 26a is output via the input/output line 39 to the ARND-A and LATCH-A paths. Similarly, the data at the specified location of the memory bank 26 is output via the input/output line 41 to the ARND-B and LATCH-B paths. As the read latches 42, 44 are open, only the data output to the ARND-A and ARND-B paths will be presented to the data multiplexer 46. However, because of the particular configuration of the data multiplexer 46 at time $t_4$, only the data travelling along the ARND-B path will be multiplexed. Accordingly, at time $t_5$, the output channel of the data multiplexer 46 will begin to output data from the memory bank 26b supplied by the ARND-B path. Furthermore, as the ARND-B path between the memory bank 26b and the data multiplexer 46 is direct, the output of multiplexed data at time $t_5$ occurs nearly instantaneously after the output of data from the memory banks 26a, 26b at time $t_4$.

The access of the specified locations of the memory banks 26a, 26b being complete at time $t_6$, the CAS~ signal is deasserted. The specified locations of the memory banks 26a, 26b will continue to output data from the specified location due to the previously discussed time delay in outputting accessed data. When the CAS~ signal is deasserted, the LATCH~ and ARND signals are promptly driven low at time $t_7$. The read latches 42, 44 close on the falling edge of the LATCH~ signal, thereby latching the Q output of the read latches 42, 44 to the D input of the read latches 42. 44, thus providing the data output from the memory banks 26a, 26b to the data multiplexer at the input channels connected to the LATCH-A and LATCH-B channels, respectively. Meanwhile, back at the data multiplexer 46, the now low ARND signal will cause the sequence controller to switch from the channels connected to the ARND paths to the channels connected to the LATCH paths. Furthermore, as the IN-EVEN signal stays low, the data multiplexer 46 will continue to receive data from the memory bank 26b, although now the data will be provided by the LATCH-B path. The IN-EVEN signal continues to stay low until the read of data from the memory bank 26b is complete. When the read of memory bank 26b is complete (at time $t_8$ in FIG. 5), the IN-EVEN signal will go high (also at time $t_8$), thereby causing the sequence controller of the data multiplexer 46 to switch at time $t_9$ from the LATCH-B path to the LATCH-A path. Thus, data from the memory bank 26a is now multiplexed onto the output of the data multiplexer 46.

Because the remaining data from the accessed location in the memory bank 26a is being provided to the data multiplexer 46 by read latch 42, a next assertion of the CAS~ signal to commence a read of a next location in the memory banks 26a, 26b, may be commenced before all of the data accessed during the previous read of first locations in the memory banks 26a, 26b is complete. Accordingly, the CAS signal is again asserted at time $t_{10}$ to begin a next read of data stored at a next location in the memory banks 26a, 26b. Upon both the assertion of the CAS~ signal at time $t_{10}$ and the transition of the IN-EVEN signal to the value it had at time $t_6$, the LATCH~ signal will go high. The read latches 42, 44 will again open, thereby completing the multiplexing by the data multiplexer 46 of data being read from the first locations of the memory banks 26a, 26b.

As can be seen from the above description of the present invention, there is provided a system for retrieving memory from a memory unit comprised of a series of interleaved memory banks. By providing a dual data path, one direct and one latched, from each interleaved memory bank to a data multiplexer, the system permits overlapping read operations, i.e. permits the read of a next location in the memory banks to begin before the read of the previous location in the memory banks has been complete while avoiding time delays which would otherwise result from the use of latches or similar circuitry to provide for such overlapping read operations.

However, those skilled in the art will recognize that many modifications and variations besides those specifically mentioned may be made in the techniques described herein without departing substantially form the concept of the present invention. Accordingly, it should be clearly understood that the form of the invention described herein is exemplary only and is not intended as a limitation on the scope of the invention.

What is claimed is:

1. A digital computer having a system for reading data from a memory unit of the type having first and second interleaved memory banks, each said memory bank having a plurality of memory locations, comprising:
    means for asserting and deasserting an access signal to specified locations of said first and second memory banks, each of said first and second memory banks outputting data stored at a first location in response to a first assertion of said access signal;
    a multiplexer having first, second and third input channels and configured to alternately receive data from said input channels, said first input channel tied directly to the output of said first memory bank;
    a first latch having an input tied to the output of said first memory bank and an output tied to said second input channel; and
    a second latch having an input tied to the output of said second memory bank and an output tied to said third input channel, said first and second latches closing in response to a first deassertion of said access signal.

2. A computer as set forth in claim 1 wherein said multiplexer receives data stored at said first location of said first memory bank from said first input channel until said first deassertion of said access signal, said multiplexer thereafter receiving data stored at said first locations of said first and second memory banks from said second and third input channels.

3. A computer as set forth in claim 2 wherein said multiplexer switches from receiving data stored at said first location of said first memory bank from said first channel to receiving data stored at said first location of said first memory bank from said second input channel upon said first deassertion of said access signal.

4. A computer as set forth in claim 3 further comprising:
means for generating a control signal to said first latch, said second latch and said multiplexer;
wherein said multiplexer switches from receiving data stored at said first location of said first memory bank to receiving data stored at said first location of said second memory bank after an assertion of said control signal and wherein said first and second latches open upon an assertion of said control signal, thereby completing the input of data from said first locations of said first and second memory banks.

5. A computer as set forth in claim 4 wherein said first and second memory banks output data stored at a next location in response to a next assertion of said access signal.

6. A computer as set forth in claim 5 wherein said access signal is further provided as an input to said control signal generating means, said control signal generating means asserting said control signal after said next assertion of said access signal.

7. A computer as set forth in claim 6 wherein said multiplexer further includes a fourth input channel tied directly to the output of said second memory bank.

8. A computer as set forth in claim 7 when said control signal generating means further comprises means for alternately selecting said first output channel, said multiplexer thereby receiving data stored at said first location of said first memory bank from said first input channel until said first deassertion of said access signal, said multiplexer thereby receiving data stored at said first location of said second memory bank from said fourth input channel until said first deassertion of said access signal, to initially receive data from said memory banks.

9. A computer as set forth in claim 8 wherein said multiplexer switches from receiving data stored at said first location of said second memory bank from said fourth input channel to receiving data stored at said first location of said second memory bank from said third input channel upon said first deassertion of said access signal.

10. A computer as set forth in claim 8 wherein said multiplexer switches from receiving data stored at said first location of said second memory bank to receiving data stored at said first location of said first memory bank from said second input channel after an assertion of said control signal.

11. A digital computer having a system for reading data from a memory unit of the type having a plurality of interleaved memory banks, each said interleaved memory bank having a plurality of locations for storage of information therein, comprising:
means for simultaneously accessing a first series of memory locations, one of said locations in each of said interleaved memory banks, to commence reading data stored therein and for selectively latching said data;
a multiplexer having a pair of input channels for each of said interleaved memory banks; and
parallel data transfer paths from each of said interleaved memory banks to said multiplexer, each of said parallel data transfer paths including a direct path from each of said interleaved memory banks to one of said pair of multiplexer input channels corresponding to that interleaved memory bank and a latched path from each of said interleaved memory banks to the other of said pair of multiplexer input channels corresponding to that bank.

12. A computer as set forth in claim 11 wherein said multiplexer receives data from said first series of accessed memory locations along said direct paths until said memory access means latches the data from said first series, said multiplexer then receiving data from said first series of accessed memory locations along said latched paths.

13. A computer as set forth in claim 12 further comprising:
a control circuit for controlling said multiplexer switching, said control circuit generating first and second output signals to said multiplexer;
wherein said first output signal controls whether said multiplexer receives data from said direct paths or said latched paths and said second output signal selects the order in which said interleaved memory banks transmit data to said multiplexer.

14. A computer as set forth in claim 13 wherein said accessing of said first series of memory locations is complete when said second output signal has switched said multiplexer to each of said channels corresponding to latched data paths.

15. A computer as set forth in claim 13 wherein each of said latched paths further comprise a latch having an input connected to one of said interleaved memory banks and an output connected to one of said multiplexer input channels.

16. A computer as set forth in claim 15 wherein said latches are open and said multiplexer receives data along said direct paths until said memory access means latches the data from said first series, said latches then closing so that said multiplexer receives data from said accessed memory locations along said latched paths.

17. A computer as set forth in claim 16 wherein said accessing means accesses memory locations by asserting an accessing signal and wherein said control circuit further comprises means for controlling said latch, said control circuit generating a third output signal to close said latches when said accessing means deasserts said accessing signal.

18. A computer as set forth in claim 17 wherein said accessing signal is provided as an input to said control circuit.

19. A computer as set forth in claim 18 wherein said second output signal is in a first state when said accessing means deasserts said accessing signal and wherein reading of said first series of interleaved memory locations is complete when said accessing signal is reasserted to begin reading of said next series of interleaved memory locations and said second output signal returns to the said first state.

20. A computer as set forth in claim 19 wherein said latches are reopened upon completing reading of said first series of interleaved memory locations.

21. A digital computer having a system for writing data to and reading data from a memory unit of the type having first and second interleaved memory banks, each said memory bank having a plurality of memory locations and an input/output data line for writing data to and reading data from said plurality of memory locations, comprising:
a two-way data bus;

means for asserting and deasserting an access signal to specified locations of said first and second memory banks, each of said first and second memory banks either outputting data stored at a first location or reading into said first location in response to a first assertion of said access signal;

a multiplexer having first, second, third and fourth input channels and an output channel tied to said two-way data bus, said multiplexer configured to alternately receive data from said input channels, said first and fourth input channels tied directly to the output of said first and second memory banks, respectively;

a first latch having an input tied to the output of said first memory bank and an output tied to said second input channel;

a second latch having an input tied to the output of said second memory bank and an output tied to said fourth input channel, said first and second latches closing in response to a first deassertion of said access signal;

a third latch having an input tied to said two-way data bus and an output tied to said first memory bank input/output line; and a fourth latch having an input tied to said two-way data bus and an output tied to said second memory bank input/output line.

22. A computer as set forth in claim 21 wherein said multiplexer receives data stored at said first location of said first memory bank from said first input channel until said first deassertion of said access signal, said multiplexer thereafter receiving data stored at said first locations of said first and second memory banks from said second and third input channels.

23. A computer as set forth in claim 22 wherein said multiplexer switches from receiving data stored at said first location of said first memory bank from said first channel to receiving data stored at said first location of said first memory bank from said second input channel upon said first deassertion of said access signal.

24. A computer as set forth in claim 23 further comprising:

means for generating a first control signal to said first latch, said second latch and said multiplexer;

wherein said multiplexer switches from receiving data stored at said first location of said first memory bank to receiving data stored at said first location of said second memory bank after an assertion of said control signal and wherein said first and second latches open upon a deassertion of said control signal, thereby completing the input of data from said first locations of said first and second memory banks.

25. A computer as set forth in claim 24 wherein said first control signal is further generated to said third latch and a second control signal is generated to said fourth latch.

26. A computer as set forth in claim 25 wherein said second control signal is generated by inverting said first control signal.

27. A computer as set forth in claim 23 wherein said first control signal latches said third latch when data to be read to said first interleaved memory is input to said two-way data bus and said second control signal latches said fourth latch when data to be read to said second interleaved memory is input to said two-way data bus.

28. A computer as set forth in claim 27 wherein said first and second memory banks output data stored at a next location in response to a next assertion of said access signal.

29. A computer as set forth in claim 28 wherein said access signal is further provided as an input to said first and second control signal generating means, said first and second control signal generating means deasserting said first control signal after said next assertion of said access signal.

30. A computer as set forth in claim 29 wherein said control signal generating means further comprises means for alternately selecting said first output channel, said multiplexer thereby receiving data stored at said first location of said first memory bank from said first input channel until said first deassertion of said access signal, or said fourth output channel, said multiplexer thereby receiving data stored at said first location of said second memory bank from said fourth input channel until said first deassertion of said access signal, to initially receive data from said memory banks.

31. A computer as set forth in claim 30 wherein said multiplexer switches from receiving data stored at said first location of said second memory bank from said fourth channel to receiving data stored at said first location of said second memory bank from said third input channel upon said first deassertion of said access signal.

32. A computer as set forth in claim 30 wherein said multiplexer switches from receiving data stored at said first location of said second memory bank to receiving data stored at said first location of said first memory bank from said second input channel after an assertion of said first control signal.

* * * * *